United States Patent
Goldberger

(10) Patent No.: US 8,878,727 B2
(45) Date of Patent: Nov. 4, 2014

(54) ANTENNA-MODULE HYBRID CIRCUIT

(75) Inventor: Haim Goldberger, Modi'in (IL)

(73) Assignee: Origin GPS Ltd., Jerusalem (IL)

(*) Notice: Subject to any disclaimer, the term of this patent is extended or adjusted under 35 U.S.C. 154(b) by 559 days.

(21) Appl. No.: 12/702,363

(22) Filed: Feb. 9, 2010

(65) Prior Publication Data

US 2010/0201580 A1     Aug. 12, 2010

Related U.S. Application Data

(60) Provisional application No. 61/151,870, filed on Feb. 12, 2009.

(51) Int. Cl.
*H01Q 1/38* (2006.01)
*H01Q 23/00* (2006.01)
*H01Q 9/04* (2006.01)

(52) U.S. Cl.
CPC .............. *H01Q 23/00* (2013.01); *H01Q 9/0407* (2013.01)
USPC ................... 343/700 MS; 343/720; 343/730; 343/906; 343/841

(58) Field of Classification Search
CPC ......... H01Q 5/00; H01Q 1/38; H01Q 9/0407; H01Q 9/0485; H01Q 1/52
USPC ................... 343/700 MS, 720, 730, 906, 841
See application file for complete search history.

(56) References Cited

U.S. PATENT DOCUMENTS

| | | | | |
|---|---|---|---|---|
| 6,646,609 | B2 * | 11/2003 | Yuasa et al. | 343/700 MS |
| 6,897,827 | B2 * | 5/2005 | Senba et al. | 343/873 |
| 2004/0017318 | A1 * | 1/2004 | Annabi et al. | 343/702 |
| 2006/0092079 | A1 * | 5/2006 | de Rochemont | 343/700 MS |
| 2007/0013599 | A1 * | 1/2007 | Gaucher et al. | 343/795 |
| 2007/0200768 | A1 * | 8/2007 | Goldberger | 343/700 MS |

* cited by examiner

*Primary Examiner* — Dameon E Levi
*Assistant Examiner* — Collin Dawkins
(74) *Attorney, Agent, or Firm* — Soroker-Agmon

(57) ABSTRACT

A hybrid circuit with an integral antenna module, including an electronic circuit that includes circuit elements; and an antenna module including a dielectric material shaped to form a void enclosed by the dielectric material, a conducting patch on one side of the dielectric material. Wherein the circuit elements are enclosed by the dielectric material, so that the elements of the circuit are positioned inside the void formed by the dielectric material.

10 Claims, 2 Drawing Sheets

ANTENNA-MODULE HYBRID CIRCUIT

FIELD OF THE INVENTION

The present invention relates generally to an Antenna Module hybrid circuit.

BACKGROUND OF THE INVENTION

Nowadays people make use of many electronic devices on a daily basis, for example mobile telephones, GPS navigation systems, radios, MP3 players, PDAs, laptop computers, digital cameras, mobile TV and many other devices. It is a common interest for manufacturers to reduce the size of the circuits controlling the devices since the users are interested in small lightweight devices, which can easily be carried around. Additionally, there is an interest in combining devices together so that a single device can replace multiple devices. Thus a person can carry a single lightweight device, which performs the functions of a plurality of devices that they previously carried around.

In order to miniaturize the devices manufacturers produce hybrid circuits or multi-chip modules which provide the complete functionality of the device in a single chip or miniaturized package. Integration of a full device into a single chip or package is generally advantageous in terms of cost, size, weight, power consumption and other factors.

One problem faced by manufacturers in integration of a full wireless system (e.g. Wi-Fi, Bluetooth, mobile telephone) into a single hybrid circuit package. Generally, the manufacturers integrate all circuit elements of the device into a single chip or hybrid circuit encapsulation except the antenna. The antenna is generally excluded because it is subject to size constraints in order to provide satisfactory performance. Additionally, the antenna is subject to interference, from the circuit and to low gain because of the circuit and the packaging.

SUMMARY OF THE INVENTION

An aspect of an embodiment of the invention, relates to a hybrid circuit including an electronic circuit and an antenna module shaped to form an enclosure that surrounds the elements of the electronic circuit so that they don't protrude beyond the enclosure of the antenna module. Optionally, the antenna module includes a patch conducting layer and a ground layer with a dielectric material placed between the two layers. In some embodiments of the invention, the ground layer is omitted. The dielectric material is shaped to form an enclosure with a void below the ground layer for accommodating electronic elements inside the enclosure of the antenna. In some embodiments of the invention the dielectric material forms a box with a rectangular or square shaped footprint. Alternatively, the footprint may have other shapes, for example a circle or oval.

In some embodiments of the invention, the electronic elements are placed on a substrate, for example a PCB (printed circuit board) and the antenna covers the electronic elements protruding from the substrate, with the substrate serving as a lid for the enclosure formed by the antenna. Alternatively, the electronic elements are placed on an interconnect layer inside the enclosure of the antenna so that the circuit is completely enclosed when mounted onto a surface. In some embodiments of the invention, the interconnect layer is placed on the back of the ground layer of the antenna. Alternatively, the interconnect layer also serves as the ground layer of the antenna.

In an exemplary embodiment of the invention, the patch conducting layer is printed on the dielectric material. Alternatively, the patch conducting layer is a thin metal layer that is attached to the dielectric layer.

In an exemplary embodiment of the invention, the internal void of the antenna, for example the volume between the circuit and the ground plate or the volume between the ground plate and up to the ends of the dielectric material, are filled with a filling material. The filling material is for example made up from an epoxy resin to form a robust solid unit that can withstand external pressure. In some embodiments of the invention, the patch antenna and the circuit are held together by the filling material after it is cured. In some embodiments of the invention the patch antenna and circuit are surrounded by an additional encasement and filled with the filling material to form a robust monolithic package. Alternatively, the patch antenna and circuit are placed in a mold, when injecting the filling, material and cured to form a solid monolithic package.

In an exemplary embodiment of the invention, the short distance between the circuit and the patch antenna helps to reduce noise and prevent attenuation of the signal received from the antenna by the circuit.

In some embodiments of the invention, more than one antenna is integrated into the circuit to provide a circuit for multiple functions, for example an antenna for GPS and for GPRS.

Optionally, the footprint of the single physical unit is smaller than 100 mm by 100 mm, 20 mm by 20 mm or even 10 mm by 10 mm. In an exemplary embodiment of the invention, the width and length of the footprint of the single physical unit are each at least twice the size of the thickness of the single physical unit.

There is thus provided according to an exemplary embodiment of the invention, a hybrid circuit with an integral antenna module, including:
  an electronic circuit including circuit elements; and
  an antenna module comprising:
    a dielectric material shaped to form a void enclosed by the dielectric material;
    a conducting patch on one side of the dielectric material;
    wherein the circuit elements are enclosed by the dielectric material, so that the elements of the circuit are positioned inside the void formed by the dielectric material.

In an exemplary embodiment of the invention, the hybrid circuit further includes a ground patch on the other side of the dielectric material facing the void. Optionally, the hybrid circuit further includes a substrate serving as a cover to the void formed by the dielectric material and wherein the circuit elements are embedded in the substrate with the elements extending into the void. In an exemplary embodiment of the invention, the circuit elements are embedded on an interconnect layer adjacent to the ground patch with the elements extending into the void. Optionally, the interconnect layer serves as the ground of the antenna. In an exemplary embodiment of the invention, the interconnect layer is coupled to the ground of the antenna. Optionally, the antenna is adapted to serve as a GPS antenna or a mobile telephone antenna. In an exemplary embodiment of the invention, the void is filled with a filling material surrounding the circuit elements. Optionally, the filling material is cured to form a solid hybrid circuit. In an exemplary embodiment of the invention, the width and length of the hybrid circuit are each at least twice the size of the thickness of the hybrid circuit. Optionally, the conducting patch and the ground patch have the same size and shape. In an exemplary embodiment of the invention, the conducting patch and the ground patch differ in size. Optionally, the conducting patch and the ground patch differ in shape. In an exemplary embodiment of the invention, the electronic circuit is connected to the conducting plate through the dielectric material. Optionally, the electronic circuit is connected to the conducting plate with a connection that goes around the dielectric material.

BRIEF DESCRIPTION OF THE DRAWINGS

The present invention will be understood and better appreciated from the following detailed description taken in conjunction with the drawings. Identical structures, elements or parts, which appear in more than one figure, are generally labeled with the same or similar number in all the figures in which they appear, wherein.

DETAILED DESCRIPTION

Figure 1:
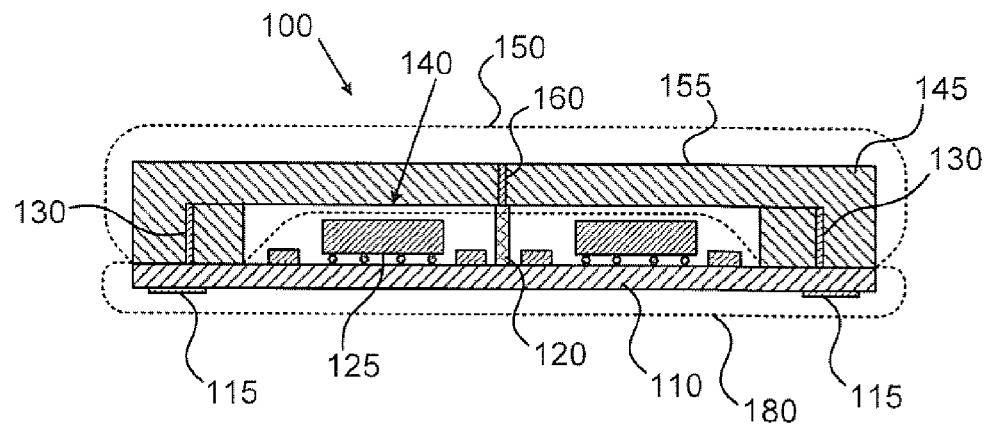
FIG. 1 is a schematic illustration of a cross sectional view of a hybrid circuit including an electronic circuit and an integral patch antenna enclosing the electronic circuit, according to an exemplary embodiment of the invention.

FIG. 1 is a schematic illustration of a cross sectional view of a hybrid circuit 100 including an electronic circuit 180 and an integral planar patch antenna (antenna module) 150 enclosing the electronic circuit, according to an exemplary embodiment of the invention. In an exemplary embodiment of the invention, a substrate 110 (e.g. a PCB—printed circuit board) is used as a base for preparing circuit 100. Alternatively, other materials or constructions can be used to serve as the base for circuit 100. In an exemplary embodiment of the invention, various types of circuit elements 125 are used to construct circuit 100, for example circuit elements 125 may include: 1. Passive devices (e.g. resistors, capacitors): 2. Active devices, which require a power source for them to operate (e.g. integrated circuits, transistors), or 3. Other elements, for example discrete elements (e.g. diodes).

Optionally, some elements are embedded in substrate 110, some elements are surface mounted on substrate 110 and some are fitted into holes on substrate 110 and soldered thereon, or connected to substrate 110 according to other methods known in the art. Optionally, substrate 110 may be provided from various materials, for example glass-epoxy, Alumina, Teflon or other types of ceramic, glass ceramics, polymers or provided as a metal lead frame. In an exemplary embodiment of the invention, circuit 100 is provided with one or more contacts 115 for connecting between the module formed by hybrid circuit 100 and other circuits or devices. In some embodiments of the invention, contacts 115 are ball grid array contacts (BGA), land grid array (LGA) or other types of contacts. Optionally, the contacts may be at the corners of the circuit, in the middle, around the circumference or in any other position under substrate 110.

In an exemplary embodiment of the invention, circuit 100 is implemented to provide functionality for a GPS (global positioning system) device, a mobile telephone (e.g. GPRS/GSM) device, a wireless network (Wi-Fi) device or other types of devices, which require communication at frequencies ranging between 0.01 GHz to 100 GHz, for example radio frequency at about 80 MHz, GPS at about 1.5 GHz, WI-FI at about 2.4 GHz and radar at about 70 GHz. In an exemplary embodiment of the invention, patch antenna 150 is mounted as a roof over elements 125 to provide the ability to transmit and receive communications as an integral part of hybrid circuit 100. In an exemplary embodiment of the invention, patch antenna 150 is formed from a conductor plate 155 and optionally a parallel ground plate 140. Optionally, a feed line 160 serves as a conducting connection between conductor patch plate 155 and electronic circuit 180 to handle the signal provided by antenna 150. In an exemplary embodiment of the invention, conductor plate 155 is shaped as a square, a parallelogram, a trapezoid, a quadrilateral, a circle, an ellipse or other planar shapes, including a wire frame located in a single plane. Optionally, ground plate 140 is of a similar shape as conductor plate 155. In an exemplary embodiment of the invention, a dielectric material 145 is placed between the plates in order to allow reduction of the size required for the plates (140,155) depending on the composition of the dielectric material used. In some embodiments of the invention, ground plate 140, conductor plate 155 are of equal size. Alternatively, one layer may be larger than the other layer or both layers may be different in size. In some embodiments of the invention, ground plate 140 is omitted. In an exemplary embodiment of the invention, the dielectric layer extends beyond the size of the conductor plate 155 and ground plate 140 to form an encasement with a void for accommodating the electronic elements of electronic circuit 180.

In some embodiments of the invention, patch antenna 150 may be provided as a dielectric antenna, wherein conductor plate 155 is small relative to the ground plate, or that conductor plate 155 is a point of negligible size relative to dielectric 145 or ground plate 140, and dielectric 145 essentially serves as the antenna receptor.

Typically, a patch antenna with a vacuum between the plates generally requires conductor plate 155 to have a length of about half the size of the wavelength of the transmission signal used, for example for GPS that uses a frequency of approximately 1.5-1.6 GHz, half a wavelength would be about 95 mm, which is slightly large for implementing as patch antenna 150 in a hybrid circuit. Optionally, by using dielectric material 145, high k tape CT765 (manufactured by Heraeus Inc. from PA USA) or low temperature capacitor tapes from series 412XX (manufactured by ESL Electro-Science from PA, USA) or a combination of other dielectric materials, the optimal size can be reduced even tenfold. Thus a size of about 10 mm by 10 mm for patch antenna 150 would suffice to serve as a GPS antenna. The following equation provides a general calculation for determining the required length for a patch antenna based on the dielectric constant: $L = C/2f(\in)^{1/2}$ Wherein L=the patch size length, C=the speed of light, f=the wave frequency under consideration, and $\in$ is the dielectric constant.

In an exemplary embodiment of the invention, the thickness of patch antenna 150 is dependent on the transmission frequency, since the thickness is related to the amount of size reduction required. Optionally, if less size reduction is required a thinner dielectric material would suffice. Additionally, the thickness of patch antenna 150 is also dependent on the materials used, some materials function with thinner plates and a thinner layer of dielectric material 145, for example conductor plate 155 may be provided from a thin (e.g. from 1 micron to 1 mm) plate made from Cu (copper), Au (Gold), Ag (Silver), AgPd (silver palladium) or other metals, and ground plate 140 may also be provided from a thin (e.g. from 1 micron to 1 mm) Cu, Au, Ag or AgPd plate. Likewise, the thickness of the dielectric material may depend on the type of dielectric material used, for example between 0.1 mm to 2 mm or even 5 mm or 10 mm may be required. In some embodiments of the invention, conductor plate 155 and ground plate 140 may be provided as a metal coating on the dielectric material to reduce the thickness of conductor antenna 150 (e.g. with a thickness of 1-100 micron). Optionally, the packaging of hybrid circuit 100 is selected to conform to modular packages available in the field so that it can be readily implemented in other circuits. In an exemplary embodiment of the invention, the size of the footprint of a typical hybrid circuit 100 may vary from about 5 mm×5 mm to about 100 mm×100 mm and the thickness may vary from about 1 mm to about 10 mm. In some embodiments of the invention, hybrid circuit 100 may be packaged with various shaped footprints, for example as a rectangle, trapezoid, circle, ellipse or other shapes. Optionally, the size of patch antenna 150 is designed to be about the same as the size of electronic circuit 180 and vice versa, for example electronic circuit 180 may be enlarged to be about the same size as patch antenna 150 or the size of patch antenna 150 may be enlarged to be about the size of electronic circuit 180. In an exemplary embodiment of the invention, the width and length of the footprint of hybrid circuit 100 are at least twice as long as the thickness of hybrid circuit 100.

Optionally, hybrid circuit 100 has a connection 120 between patch antenna 150 and electronic circuit 180, which enables the provision of a signal to patch antenna 150 from electronic circuit 180 and reception of a signal from patch antenna 150, via feed line 160 to electronic circuit 180. Optionally, ground plate 140 is connected by a connection 130 to substrate 110.

Figure 2:
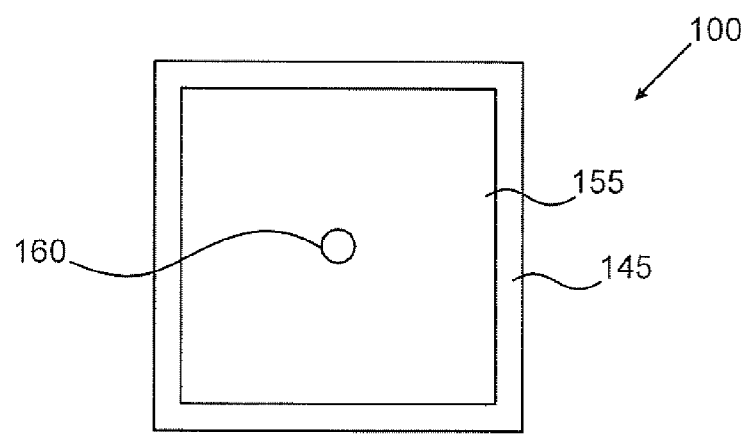
FIG. 2 is a schematic illustration of a top view of an integral patch antenna, according to an exemplary embodiment of the invention.

FIG. 2 is a schematic illustration of a top view of patch antenna 150, according to an exemplary embodiment of the invention.

Figure 3A:
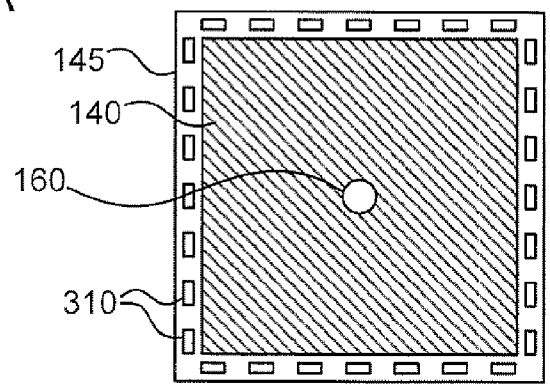
FIG. 3A is a schematic illustration of a bottom view of an integral patch antenna, according to an exemplary embodiment of the invention.

FIG. 3A is a schematic illustration of a bottom view of patch antenna 150, according to an exemplary embodiment of the invention. In an exemplary embodiment of the invention, patch antenna 150 includes ground connectors 310 around the circumference of the bottom of patch antenna 150. Ground connectors 310 allow connection of electronic circuit 180 to ground plate 140 via connection 130. Optionally, feed line 160 enable the connection of electronic circuit 180 to conductor plate 155 of patch antenna 150. In some embodiments of the invention, ground plate 140 is omitted and ground connectors 310 are connected directly to dielectric material 145. In an exemplary embodiment of the invention, when ground plate 140 is omitted the ground of electronic circuit 180 serves also as the antenna ground to improve the gain of the antenna.

Figure 3B:
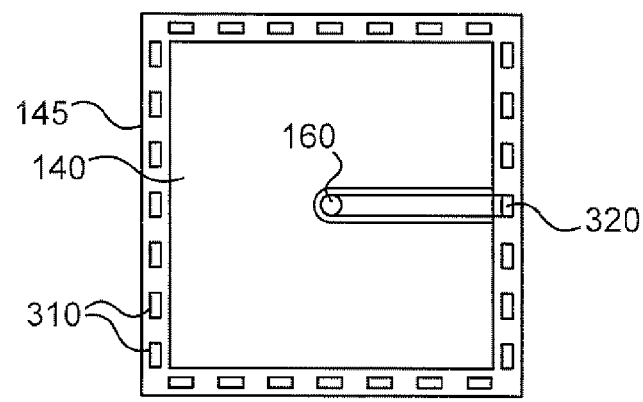
FIG. 3B is a schematic illustration of an alternative bottom view of an integral patch antenna, according to an exemplary embodiment of the invention.
Figure 3C:
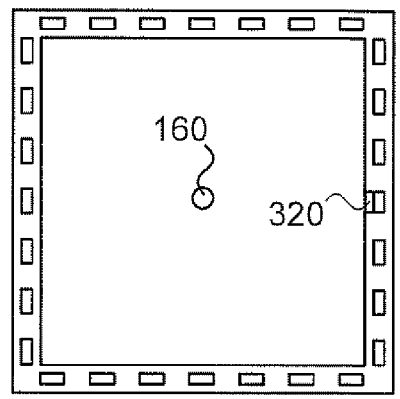
FIG. 3C is a schematic illustration of an additional alternative bottom view of an integral patch antenna, according to an exemplary embodiment of the invention.

FIG. 3B is a schematic illustration of an alternative bottom view of patch antenna 150, and FIG. 3C is a schematic illustration of an additional alternative bottom view of an integral patch antenna, according to an exemplary embodiment of the invention. In an exemplary embodiment of the invention, feed line 160 extends in parallel to the patch antenna either on the surface of ground plate 140 (FIG. 3B) or on the surface of dielectric material 145, wherein a path is cleared by removing a line of the ground plate (FIG. 3B). The feed line forms a patch connector 320 on the bottom of dielectric material 145, so that electronic circuit 180 can contact conductor plate 155 without using connection 120 in the middle of patch antenna 150, similar to ground connectors 310. In some embodiments of the invention, any other position can be designed to connect between conductor plate 155 and electronic circuit 180. In some embodiments of the invention, ground plate 140 is positioned below patch connector 320 as shown in FIG. 3C.

Figure 4:
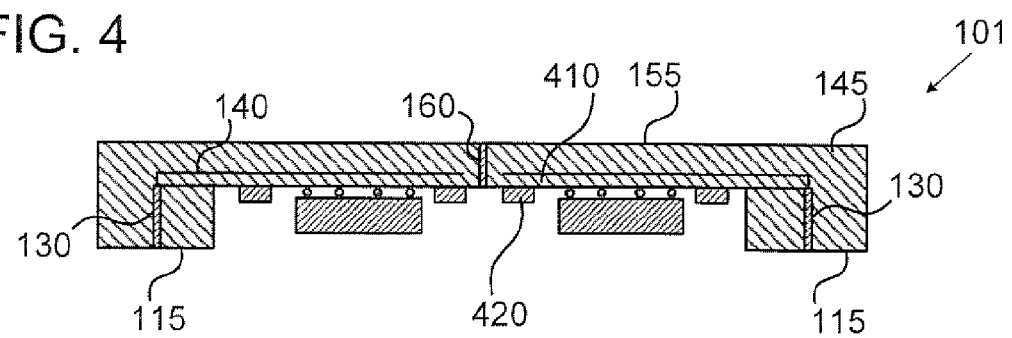
FIG. 4 is a schematic illustration of a cross sectional view of an alternative hybrid circuit including an electronic circuit and an integral patch antenna, according to an exemplary embodiment of the invention.

FIG. 4 is a schematic illustration of a cross sectional view of an alternative hybrid circuit 101 with an integral patch antenna, according to an exemplary embodiment of the invention. In an exemplary embodiment of the invention, hybrid circuit 101 is similar to hybrid circuit 100 including conductor patch 155, ground plate 140 and dielectric material 145. However in hybrid circuit 101 an electronic circuit 420 is placed on the back of ground plate 140 instead of being covered by it as with electronic circuit 180. Optionally, an inter-connect layer 410 is coupled to ground plate 140 and circuit elements 125 are placed on the inter-connect layer.

In some embodiments of the invention, ground plate 140 serves as the inter-connect layer of electronic circuit 420. Alternatively, ground plate 140 is omitted and the inter-connect layer 410 is placed directly on dielectric material 145. Optionally, inter-connect layer 410 is made up from materials suitable to serve as a substrate (e.g. a mixture of materials such as CT765 and CT707 manufactured by Heraeus or FR4 and the like).

Similar to hybrid circuit 100 in hybrid circuit 101 various types of circuit elements 125 are used, for example circuit elements 125 may include:

1. Passive devices (e.g. resistors, capacitors);
2. Active devices, which require a power source for them to operate (e.g. integrated circuits, transistors), or
3. Other elements, for example discrete elements (e.g. diodes).

Optionally, some elements are embedded in inter-connect layer 410, some elements are surface mounted on inter-connect layer 410, some are fitted into holes on inter-connect layer 410 and soldered thereon, or connected to inter-connect layer 410 by other methods known in the art. In an exemplary embodiment of the invention, hybrid circuit 101 is provided with one or more contacts 115 for connecting between the module formed by hybrid circuit 101 and other circuits or devices. In some embodiments of the invention, contacts 115 are ball grid array contacts (BGA), land grid array (LGA) or other types of contacts. Optionally, the contacts may be at the corners of the circuit, in the middle or in any other position under hybrid circuit 101.

In an exemplary embodiment of the invention, hybrid circuit 101 is implemented to provide functionality for a GPS (global positioning system) device, a mobile telephone (e.g. GPRS/GSM) device, a wireless network (Wi-Fi) device or other types of devices, which require communication at frequencies ranging between 0.01 GHz to 100 GHz, for example radio frequency at about 80 MHz, GPS at about 1.5 GHz, WI-FI at about 2.4 GHz and radar at about 70 GHz. In an exemplary embodiment of the invention, patch antenna 150 is formed from a conductor plate 155 and a parallel ground plate 140. Optionally, a feed line 160 serves as a conducting connection between conductor patch plate 155 and electronic circuit 420 to handle the signal provided by antenna 150. In an exemplary embodiment of the invention, conductor plate 155 is shaped as a square, a parallelogram, a trapezoid, a quadrilateral, a circle, an ellipse or other planar shapes, including a wire frame located in a single plane. Optionally, ground plate 140 is of a similar shape as conductor plate 155. In an exemplary embodiment of the invention, a dielectric material 145 is placed between the plates in order to allow reduction of the size required for the plates (140,155) depending on the composition of the dielectric material used. In some embodiments of the invention, ground plate 140, conductor plate 155 and dielectric 145 are all of equal size. Alternatively, one layer may be larger than the other layers or all the layers may be different in size.

Optionally, hybrid circuit 101 has a connection 130, to allow a connection between ground plate 140 and external devices through the antenna dielectric.

It should be appreciated that the above described methods and apparatus may be varied in many ways, including omitting or adding steps, changing the order of steps and the type of devices used. It should be appreciated that different features may be combined in different ways. In particular, not all the features shown above in a particular embodiment are necessary in every embodiment of the invention. Further combinations of the above features are also considered to be within the scope of some embodiments of the invention.

It will be appreciated by persons skilled in the art that the present invention is not limited to what has been particularly shown and described hereinabove. Rather the scope of the present invention is defined only by the claims, which follow.

The invention claimed is:

1. A hybrid circuit with an integral antenna module, comprising:
    an electronic circuit comprising circuit elements incorporated on a substrate below the circuit elements; and
    an antenna module comprising:
        a dielectric material; wherein the dielectric material alone is continuously shaped to form a void that encapsulates all the circuit elements of the electronic circuit;
        a single conducting plate on one side of the dielectric material
        a ground plate on the other side of the dielectric material facing the void above the circuit elements to provide a protective shield for the antenna from the circuit elements; and
    wherein the dielectric material extends outward beyond the ground plate reaching down to the substrate below the circuit elements forming the void and encapsulating the circuit elements.

2. A hybrid circuit according to claim 1, wherein said antenna is adapted to serve as a GPS antenna or a mobile telephone antenna.

3. A hybrid circuit according to claim 1, wherein the void is filled with a filling material surrounding the circuit elements.

4. A hybrid circuit according to claim 3, wherein the filling material is cured to form a solid hybrid circuit.

5. A hybrid circuit according to claim 1, wherein the width and length of the hybrid circuit are each at least twice the size of the thickness of the hybrid circuit.

6. A hybrid circuit according to claim 1, wherein the conducting plate and the ground plate have the same size and shape.

7. A hybrid circuit according to claim 1, wherein the conducting plate and the ground plate differ in size.

8. A hybrid circuit according to claim 1, wherein the conducting plate and the ground plate differ in shape.

9. A hybrid circuit according to claim 1, wherein said electronic circuit is connected to said conducting plate through said dielectric material.

10. A hybrid circuit according to claim 1, wherein said electronic circuit is connected to said conducting plate with a connection that goes around said dielectric material.

* * * * *